(12) United States Patent
O'Brien et al.

(10) Patent No.: US 10,840,416 B2
(45) Date of Patent: Nov. 17, 2020

(54) OPTOELECTRONIC COMPONENT AND METHOD FOR PRODUCING AN OPTOELECTRONIC COMPONENT

(71) Applicant: OSRAM OLED GmbH, Regensburg (DE)

(72) Inventors: David O'Brien, Portland, OR (US); Georg Dirscherl, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/079,542

(22) PCT Filed: Feb. 24, 2017

(86) PCT No.: PCT/EP2017/054366
§ 371 (c)(1),
(2) Date: Aug. 23, 2018

(87) PCT Pub. No.: WO2017/144680
PCT Pub. Date: Aug. 31, 2017

(65) Prior Publication Data
US 2019/0058093 A1    Feb. 21, 2019

(30) Foreign Application Priority Data
Feb. 26, 2016    (DE) .................. 10 2016 103 463

(51) Int. Cl.
*H01L 33/50*    (2010.01)
*H01L 33/04*    (2010.01)
(Continued)

(52) U.S. Cl.
CPC ............ *H01L 33/505* (2013.01); *C08L 33/04* (2013.01); *C09K 11/02* (2013.01); *H01L 33/50* (2013.01);
(Continued)

(58) Field of Classification Search
CPC ....................................... H01L 33/505
See application file for complete search history.

(56) References Cited

U.S. PATENT DOCUMENTS

2010/0051898 A1    3/2010 Kim et al.
2012/0086028 A1    4/2012 Beeson et al.
(Continued)

FOREIGN PATENT DOCUMENTS

DE    102014117764 A1    6/2016
EP         2040316 A1    3/2009

*Primary Examiner* — Moazzam Hossain
(74) *Attorney, Agent, or Firm* — Arent Fox LLP

(57) ABSTRACT

The invention relates to an optoelectronic component (100) comprising a semiconductor chip (1) configured for emitting radiation, a conversion element (2) comprising quantum dots (5) and configured for wavelength conversion of radiation, wherein the conversion element (2) comprises a layer structure (7) having a plurality of inorganic barrier layers (31, 32, 33, 34), wherein the inorganic barrier layers (31, 32, 33, 34) are spatially separated from one another at least regionally by a hybrid polymer (4), wherein the hybrid polymer (4) comprises organic and inorganic regions that are covalently bonded to one another, wherein the quantum dots (5) are embedded in the hybrid polymer (4) and/or at least in one of the barrier layers (31, 32, 33, 34).

14 Claims, 4 Drawing Sheets

Figure 1A:
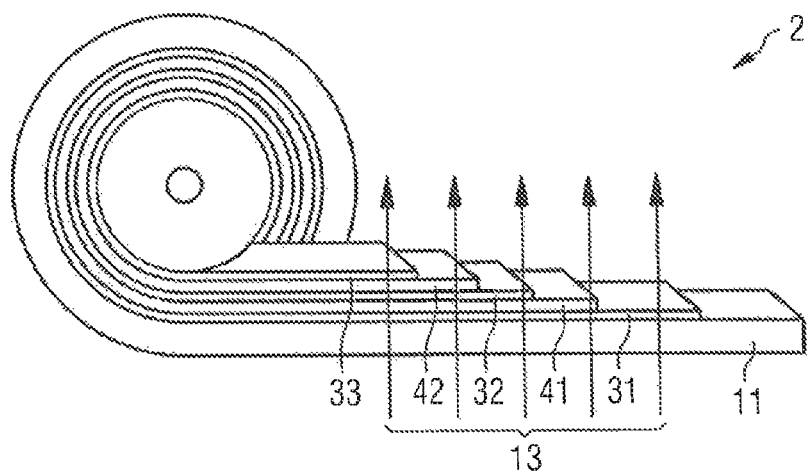

(51) Int. Cl.
  *H01L 33/06*  (2010.01)
  *H01L 33/58*  (2010.01)
  *H01L 33/56*  (2010.01)
  *H01L 33/60*  (2010.01)
  *C09K 11/02*  (2006.01)
  *C08L 33/04*  (2006.01)

(52) U.S. Cl.
  CPC .......... *H01L 33/501* (2013.01); *H01L 33/502* (2013.01); *H01L 33/507* (2013.01); *H01L 33/56* (2013.01); *H01L 33/60* (2013.01); *C08L 2666/54* (2013.01); *C08L 2666/66* (2013.01); *H01L 2933/0041* (2013.01)

(56) References Cited

U.S. PATENT DOCUMENTS

| | | | |
|---|---|---|---|
| 2013/0105854 A1 | 5/2013 | Jang et al. | |
| 2013/0187184 A1* | 7/2013 | Camras | H01L 33/507 |
| | | | 257/98 |
| 2014/0021503 A1* | 1/2014 | Yoshida | H01L 33/507 |
| | | | 257/98 |
| 2014/0346547 A1 | 11/2014 | Park | |
| 2015/0221623 A1* | 8/2015 | Tischler | H01L 25/165 |
| | | | 257/89 |
| 2017/0162764 A1* | 6/2017 | Kan | H01L 51/5237 |
| 2017/0331003 A1* | 11/2017 | Cheng | H01L 33/007 |
| 2018/0371312 A1* | 12/2018 | Dirscherl | C09K 11/025 |
| 2019/0221730 A1* | 7/2019 | Yoo | H01L 33/06 |
| 2019/0345378 A1* | 11/2019 | Armstrong | C08F 220/24 |

\* cited by examiner

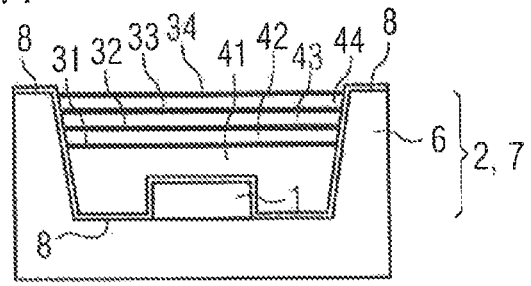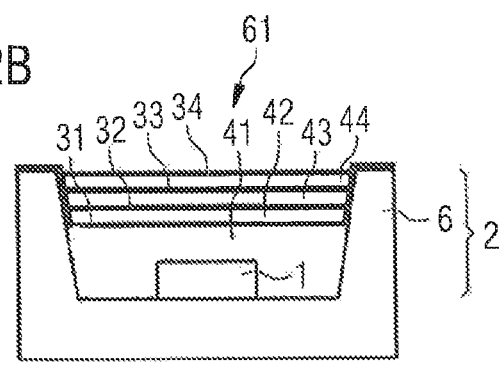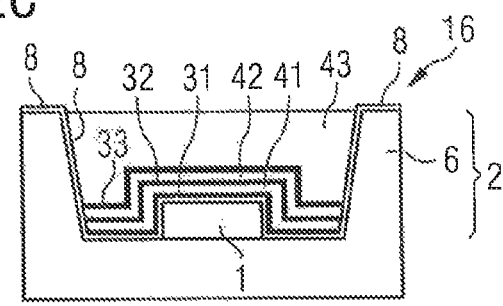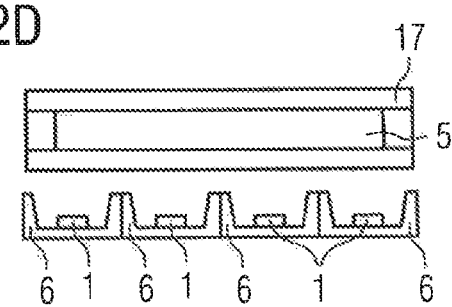

OPTOELECTRONIC COMPONENT AND METHOD FOR PRODUCING AN OPTOELECTRONIC COMPONENT

The invention relates to an optoelectronic component. The invention further relates to a method for producing an optoelectronic component.

Conversion elements frequently have converter materials, for example quantum dots. The conversion materials convert the radiation emitted by a radiation source into a radiation having a changed, for example longer, wavelength. The conversion materials are generally dispersed into a polymer-based matrix material, for example acrylates, in order to obtain the conversion material in a processable form and to protect it against environmental influences. Polymer-based matrix materials, however, have the disadvantage that they are permeable to moisture and/or oxygen and/or acidic gases from the environment. Furthermore, polymer-based matrix materials have a low aging stability. Moreover, a homogeneous and controllable distribution of the conversion materials in the matrix material is difficult to adjust.

An object of the invention is to provide an optoelectronic component which has improved properties. In particular, an optoelectronic component is to be provided which has a conversion element with good efficiency and/or blue stability and/or which can be easily produced. In addition, the optoelectronic component should be stable against environmental influences. The invention further relates to a method for producing an optoelectronic component, which produces an optoelectronic component having improved properties.

These objects are achieved by an optoelectronic component according to claim 1. Advantageous refinements and developments of the invention are the subject matter of the dependent claims 2 to 12. Furthermore, these objects are achieved by a method for producing an optoelectronic component according to claim 13. Advantageous refinements and developments of the method are the subject matter of the dependent claim 14.

In at least one embodiment, the optoelectronic component comprises a semiconductor chip. The semiconductor chip is designed to emit radiation. The optoelectronic component comprises a conversion element. The conversion element has quantum dots. The quantum dots are designed for wavelength conversion of radiation. The conversion element has a layer structure having a plurality of inorganic barrier layers. The inorganic barrier layers are spatially separated from one another at least in regions by a hybrid polymer. The hybrid polymer has inorganic and organic regions. The inorganic and organic regions are covalently bonded to one another. The quantum dots are embedded in the hybrid polymer. Alternatively or additionally, the quantum dots are embedded in at least one of the barrier layers.

According to at least one embodiment, the optoelectronic component has a semiconductor chip. The optoelectronic component can also have more than one semiconductor chip, for example two or three semiconductor chips. The at least one semiconductor chip comprises a semiconductor layer sequence. The semiconductor layer sequence of the semiconductor chip is preferably based on a III-V compound semiconductor material. The semiconductor material is preferably a nitride compound semiconductor material such as $Al_nIn_{1-n-m}Ga_mN$, or else a phosphide compound semiconductor material such as $Al_nIn_{1-n-m}Ga_mP$ wherein in each case $0 \leq n \leq 1$, $0 \leq m \leq 1$ and $n+m \leq 1$. The semiconductor material can likewise be $Al_xGa_{1-x}As$ wherein $0 \leq x \leq 1$. Further, the semiconductor layer sequence can have dopants and additional constituents. For the sake of simplicity, however, only the essential components of the crystal lattice of the semiconductor layer sequence, that is Al, As, Ga, In, N or P are mentioned, even if these can be partially replaced and/or supplemented by small quantities of further substances.

The semiconductor layer sequence comprises an active layer having at least one pn junction and/or having one or more quantum well structures. The optoelectronic component has an active layer in which an electromagnetic radiation is generated. A wavelength or the wavelength maximum of the radiation is preferably in the ultraviolet and/or visible and/or IR range, in particular at wavelengths between 420 nm and 680 nm inclusive, for example between 440 nm and 480 nm inclusive.

According to at least one embodiment, the optoelectronic component is a light-emitting diode, LED for short. The optoelectronic component is then preferably designed to emit blue or white light.

It should be noted at this point that an optoelectronic component is understood to mean not only finished components such as, for example, finished LEDs or laser diodes, but also substrates and/or semiconductor layers, so that, for example, a composite of just a copper layer and a semiconductor layer already represents an optoelectronic component and can form a component of a superordinate second optoelectronic component, in which, for example, electrical connections are additionally present. The semiconductor chip can in particular be a thin-film light-emitting diode chip.

According to at least one embodiment, the semiconductor chip has a radiation exit area. The radiation exit area is preferably oriented perpendicular to a growth direction of a semiconductor layer sequence of the semiconductor chip. The semiconductor chip preferably emits electromagnetic radiation from the violet or blue wavelength range, wherein said radiation is coupled out of the optoelectronic component via the radiation exit area.

According to at least one embodiment of the component, said component comprises a conversion element. The conversion element has quantum dots. Quantum dots are dispersed or embedded in particular in a matrix material, in particular a hybrid polymer. The quantum dots are designed for wavelength conversion or wavelength change.

The wavelength-converting quantum dots are, in particular, of a sensitive conversion material, that is a conversion material which is sensitive to oxygen, moisture and/or acid gases. Preferably, the quantum dots are nanoparticles, that is particles having a size in the nanometer range with a particle diameter $d_{50}$, for example, between at least 1 nm and at most 1000 nm. The quantum dots comprise a semiconductor core having wave-converting properties. In particular, the core of the quantum dots consists of a II/IV or III/V semiconductor. For example, the quantum dots are selected from a group comprising InP, CdS, CdSe, InGaAs, GaInP and $CuInSe_2$. The semiconductor core can be surrounded by one or more layers as a coating. The coating can be organic and/or inorganic. In other words, the semiconductor core can be completely or almost completely covered by further layers on the outer faces or surfaces thereof.

The semiconductor core can be a monocrystalline or polycrystalline agglomerate.

According to at least one embodiment, the quantum dots have an average diameter of 3 nm to 10 nm, particularly preferably from 3 to 5 nm. By varying the size of the quantum dots, the wavelength of the converted radiation can be varied in a targeted manner and thus adapted accordingly for the respective applications. The quantum dots can be spherical or can be in the shape of a rod.

According to at least one embodiment, the conversion element has a hybrid polymer. The hybrid polymer has organic and inorganic regions which are covalently bonded to one another. The hybrid polymer has, in particular, strong covalent bonds between inorganic and organic regions. In this way, the properties of very opposite materials, such as glass or ceramic, are connected to the organic polymers or silicones on a molecular level. Compared to pure polymeric materials, the hybrid polymer has outstanding optical properties and offers the possibility by its chemical structure to be tailored to the respective requirement.

Here and below, hybrid polymer is also understood to mean a compound which has inorganic regions and organic regions. The inorganic regions are in particular units of -metal-oxygen-, such as, for example, —Si—O— or —Ti—O— or —Zr—O—, wherein the metal can be cross-linked in a simple, dual or triple manner and can thus form a less or more highly cross-linked framework. The inorganic regions generally have a particle size in the range from 1 to 10 nm, in particular from 2 to 6 nm, for example 5 nm. The organic regions in the macromolecule generally have functional reactive groups. These functional groups are in particular in spatial proximity to one another. The functional groups should be completely linked to one another as far as possible from different regions. The organic crosslinking, in particular a polymerization, can be carried out, for example, via terminal C—C double bonds, such as, for example, phenyl or acrylate, or can take place by hydrosilylation. The hybrid polymer thus has both plastic and glass-like or ceramic-like properties and can be used as a particle layer or as a compact material or as a matrix material.

According to at least one embodiment, the hybrid polymer is an Ormocer® (ORganic MOdified CERamics) or OrmocX.

In addition to other structuring possibilities, in particular the nanoimprint lithography and the two-photon polymerization represent a possibility to also realize a complex three-dimensional shaping of the hybrid polymer. The hybrid polymer is particularly compatible with conventional semiconductor production processes.

The hybrid polymer can be produced by synthesis in the sol-gel process. The synthesis is carried out in the sol-gel process on the basis of organic modified alkoxysilanes and metal alkoxides. The inorganic crosslinking takes place via hydrolysis and condensation reaction of the alkoxy groups. The organic network structure can be carried out by organic crosslinking reaction of the epoxy methacrylic or phenyl groups. Zirconium oxides or titanium oxides, for example, can be used as metal oxides.

The inorganic network exhibits a high thermal stability and a very high hardness. The polymerization of the organic groups can be effected by means of heat or UV. Thus, the organic groups crosslink and polymerize and build up an organic network. The polymerizable organic groups can be, for example, acryl, phenyl or epoxy. The organic network exhibits high flexibility and processability. The hybrid polymer advantageously has a high aging resistance.

The hybrid polymer is in particular highly transparent. The term "highly transparent" is to be understood here and below that the hybrid polymer transmits more than 90% of the incident radiation, in particular transmits more than 98% of the radiation.

The hybrid polymer is in particular chemically stable, thermally stable, transparent, hard-elastic and/or easily processable under mild reaction conditions.

The hybrid polymer can be crosslinked thermally and/or by radiation. In particular, the hybrid polymer can be thermally crosslinked at temperatures of <270° C., in particular <150° C. or <100° C. Alternatively or additionally, the hybrid polymer can be crosslinked by UV radiation, that is a radiation having a wavelength maximum of <400 nm, for example 375 nm. During the crosslinking, covalent bonds are formed between the organic and inorganic regions so that a three-dimensional network is produced.

The hybrid polymer can be exposed either by means of conventional UV lithography and thus thermally and/or radiation-crosslinked. The hybrid polymer can alternatively or additionally be processed by means of laser direct imaging (LDI) or UV-molding. UV-molding here refers, in particular, to a combination of a molding process and UV exposure for crosslinking the hybrid polymer. Various methods for processing can be used for thermal crosslinking or structuring of the hybrid polymer, depending on the viscosity of the starting material, for example molding or jetting.

The above-mentioned methods can also be combined with one another. For example, the molding can be carried out with a structured transparent molding tool, for example a stamp, and the exposure can be carried out by means of LDI, for example by means of a laser.

According to at least one embodiment, the hybrid polymer is selected from a group comprising Ormocor, Ormoclad, Ormoclear, InkOrmor, Ormocomp, Ormostemp, Ormoclear10 and Ormoclear30. These designations are trade names and commercially available, for example from the Fraunhofer company or from Microresist Technology GmbH.

According to at least one embodiment, Ormoclear is used as a hybrid polymer. In particular, Ormoclear10 and/or Ormoclear30 is used.

According to at least one embodiment, the Ormoclear is used as a UV-structurable hybrid polymer for use in a light-emitting diode.

According to at least one embodiment, Ormocomp is used as the hybrid polymer. Ormocomp is a UV-curable hybrid polymer which can be UV-structured. Ormocomp can be structured by means of lithography and/or embossing methods.

The embedding of the quantum dots in the hybrid polymer causes a good interaction between the quantum dots and the hybrid polymer as matrix material. In particular, the organic groups for the polymerization can be produced similarly to acrylates or other suitable matrix materials and interact with the quantum dots. The hybrid polymer can in particular be modified in such a way that it has no strong polar groups and, thus, a chemical degradation or quenching of the quantum dots is avoided.

The hybrid polymer has in particular a very good barrier property and can thus be used as an encapsulation together with the inorganic barrier layers. In particular, the network of inorganic and organic regions leads to a highly crosslinked hybrid polymer which has a low permeability to oxygen and water compared to other matrix materials, such as, for example, acrylates or silicones.

The hybrid polymer can be changed in such a way that it has improved adhesion to the semiconductor chip or to the housing of the optoelectronic component and, thus, a delamination is avoided. In particular, this can be realized by organically modified silicon alkoxides which are functionalized by organic polar groups such as OH, and thus the adhesion is improved (PPA, PCT). Alternatively, these can also be modified with non-polar aliphatic, organic groups and can then be bound to a housing or surface which has, for example, fluoropolymers.

The hybrid polymer can be cured by means of heat or UV. In particular, an initiator can be added to the hybrid polymer for curing. The curing by means of UV avoids high thermal stress during the thermal process (>120° C.) and, thus, damage to the quantum dots can be avoided. UV curing can be effected by means of photolithography.

The embedding of the quantum dots in the hybrid polymer shows a sufficient blue stability. The hybrid polymer is more blue-stable than other matrix materials, such as, for example, acrylates (>50 W/cm$^2$ by means of a life test).

According to at least one embodiment, the conversion element has a layer structure having a plurality of inorganic barrier layers.

The barrier layers have, in particular, a material selected from the group comprising silicon dioxide, aluminum oxide, titanium oxide, zinc-tin oxide (ZTO), silicon nitride and combinations thereof. The inorganic barrier layer can be produced by means of various methods such as, for example, evaporation, plasma-enhanced chemical vapor deposition (PECVD), atomic layer deposition methods (ALD) or laser ablation (PLD).

The inorganic barrier layers protect in particular the quantum dots from environmental influences. A conversion element can be provided by combining the inorganic barrier layers with the hybrid polymer and the quantum dots, the conversion element simultaneously acts as an encapsulation element for the conversion material. The inorganic barrier layers or films have a water vapor permeability rate WVTR of $10^{-3} \ldots 10^{-6}$ g/(m$^2$·d).

According to at least one embodiment, the semiconductor chip is arranged in a recess of a housing. The conversion element is arranged in the beam path of the semiconductor chip and has a layer structure. The layer structure of the conversion element has in particular at least four, five, six, seven, eight, nine or ten, preferably at least 15 or exactly 15 inorganic barrier layers, wherein the layer structure has an alternating layer sequence comprising an inorganic barrier layer and a layer comprising the hybrid polymer. The optoelectronic component can additionally have a further barrier layer which covers the surface of the recess of the housing and/or the surfaces of the semiconductor chip in a form-fitting manner. The term "form-fitting" means that the entire surface of the semiconductor chip or of the recess is covered by the further barrier layer.

According to at least one embodiment, the semiconductor chip is arranged in a recess of a housing and the conversion element is arranged in the beam path of the semiconductor chip. The layer structure of the conversion element has at least four, five, six, seven, eight, nine or ten, in particular 15 or exactly 15, inorganic barrier layers, which form an alternating layer sequence comprising an inorganic barrier layer and a layer comprising the hybrid polymer. In particular, the component has a further layer which comprises or consists of the hybrid polymer which covers the surfaces of the recess of the housing and/or the surfaces of the semiconductor chip in a form-fitting manner.

An alternating layer sequence comprising an inorganic barrier layer and a layer comprising the hybrid polymer is to be understood here and below, for example, in that ten inorganic barrier layers are separated from one another by a layer comprising the hybrid polymer so that an alternating sequence of inorganic barrier layer, hybrid polymer layer, inorganic barrier layer, hybrid polymer layer and so on is formed.

According to at least one embodiment, the layer covering the surfaces of the recess and/or of the semiconductor chip, that is the further layer, has a thickness in cross section between 100 μm and 1000 μm inclusive. In particular, the thickness of the layer is of non-homogeneous design in cross section. In other words, the further layer preferably forms a volume potting.

According to at least one embodiment, the layer covering the surfaces of the recess and/or of the semiconductor chip, that is the further layer, has a homogeneous layer thickness between 0.2 μm and 100 μm inclusive. A homogeneous layer thickness in particular means a maximum tolerance of 2% from the average layer thickness.

According to at least one embodiment, the quantum dots have a proportion of between 0.001% and 5% by weight in the hybrid polymer.

According to at least one embodiment, the conversion element is arranged in the beam path of the semiconductor chip. The layer structure has at least two alternating layer sequences of an inorganic barrier layer and a layer comprising the hybrid polymer. Thus, at least two inorganic barrier layers and two hybrid polymer layers are present. In particular, the side faces of the semiconductor chip and the side faces of the conversion element have an identical lateral extent in cross-section, that is with a tolerance of at most 1%, 1.5% or 2% of the average lateral extent. The side faces are covered by a further barrier layer in a form-fitting manner.

According to at least one embodiment, the component can be introduced into a recess of a housing. In other words, the conversion element is produced outside the housing and, after the conversion element has been produced, the semiconductor chip and the conversion element are mounted in a housing.

According to at least one embodiment, the semiconductor chip is arranged in a recess of a housing and the conversion element is arranged in the beam path of the semiconductor chip. The layer structure has at least one alternating layer sequence comprising an inorganic barrier layer and a layer comprising the hybrid polymer. A further layer covers in particular the surfaces of the recess of the housing and/or the surfaces and side faces of the semiconductor chip in a form-fitting manner. In addition, a reflector element, which in particular comprises or consists of titanium dioxide, is laterally arranged with respect to the semiconductor chip, the reflector element surrounds the side faces of the semiconductor chip.

Quantum dots are very sensitive to environmental influences, for example oxygen and atmospheric humidity, and therefore have to be isolated from the external environment. Furthermore, the quantum dots must have a certain distance from one another in order to avoid quenching. The interaction between a quantum dot and a matrix material is very complex. For example, polar groups or an electrically conductive material can reduce the exciton yield of the quantum dots and lead to quenching of the quantum dots. The component would therefore have a low efficiency. The inventors have now recognized that by embedding of the quantum dots into a hybrid polymer as matrix material, these disadvantages described above can be overcome. In addition, the hybrid polymer, in combination with the inorganic barrier layers, forms an encapsulation against environmental influences. It is thus possible to dispense with other encapsulation elements, such as glass and PET films. If in comparison thereto, for example, matrix materials based on acrylate are used and inorganic barrier layers are supplied, the problem arises that the inorganic barrier layers cannot be directly processed with the acrylate. Furthermore, acrylates or other organic materials have a low stability under blue or UV light. Thus, conventional matrix materials for quantum dots are only insufficiently suitable.

The invention further relates to a method for producing an optoelectronic component. The method for producing the optoelectronic component preferably produces the optoelectronic component described above. This means that all the features disclosed for the method are also disclosed for the optoelectronic component and vice versa.

According to at least one embodiment, the method comprises the following steps:
A) providing a substrate,
B) applying at least one semiconductor chip to the substrate,
C) applying an inorganic barrier layer to the substrate and to the semiconductor chip,
D) applying a layer of a hybrid polymer which has organic and inorganic regions that are covalently bonded to one another, wherein quantum dots are embedded in the hybrid polymer,
E) structured curing of at least the hybrid polymer by means of UV or heat,
F) applying additional barrier layers and/or additional layers comprising the hybrid polymer so that a layer structure is produced from an alternating sequence of barrier layers and layers comprising the hybrid polymer.

In particular, the structured curing is carried out by means of a mask.

According to at least one embodiment, glass, quartz, plastic films, metal, metal foils, silicon wafers or another suitable substrate material are used as the substrate.

According to at least one embodiment, the method steps A) to F) are performed one after the other and the temperature of each method step is at most 100° C. This prevents that the quantum dots degrade due to excessive temperature.

Further advantages, advantageous embodiments and developments result from the exemplary embodiments described below in conjunction with the figures.

Figure 1B:
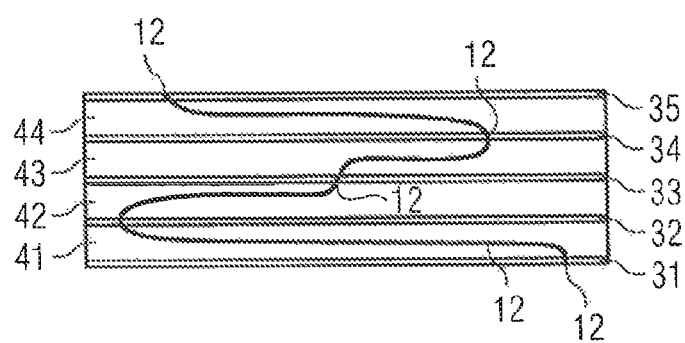

FIGS. 1A and 1B each show a conversion element according to an embodiment,

FIGS. 2A to 2C each show a schematic side view of an optoelectronic component according to an embodiment, FIG. 2D shows a schematic side view of an optoelectronic component according to a comparative example, FIGS. 3A to 3F show a method for producing an optoelectronic component according to an embodiment, FIGS. 4A to 5B each show a schematic side view of an optoelectronic component according to an embodiment.

In the exemplary embodiments and figures, identical, similar or identically acting elements can in each case be provided with the same reference signs. The elements illustrated and their size relationships among one another are not to be regarded as true to scale. Rather, individual elements, such as, for example, layers, elements, components and regions, are represented with an exaggerated size for better representability and/or for a better understanding.

FIG. 1A shows a schematic side view of a conversion element 2 which is arranged on a substrate 11. In particular, the conversion element 2 is transparent. The conversion element 2 has inorganic barrier layers 31, 32, 33 and the hybrid polymer 41, 42, 43. The inorganic barrier layers 31, 32, 33 are each spatially separated from one another by a layer comprising the hybrid polymer 41 and 42. The conversion element has a diffusion coefficient for water of $2.10^4$ g/m$^2$·d at 38° C. and 90% of atmospheric humidity.

The inventors have recognized that the hybrid polymer 4 can successfully be combined with an inorganic barrier layer 3 and, thus, an effective barrier layer structure, which serves as an encapsulation, can be used for quantum dots.

FIG. 1B shows an alternating layer structure of the conversion element 2. The conversion element 2 has inorganic barrier layers 31, 32, 33, 34, 35, which are each separated spatially from one another by layers comprising the hybrid polymer 41, 42, 43, 44. The layer structure can have defects or pinholes 12 which can lead to a dramatic reduction of the transmission. It is therefore desirable to use a plurality of inorganic barrier layers, in particular at least ten or 15 barrier layers, in order to achieve sufficient encapsulation of the quantum dots against environmental influences.

FIGS. 2A to 2C each show a schematic side view of an optoelectronic component according to an embodiment. The optoelectronic component 100 of FIG. 2A has a housing 6 with a recess 61. A semiconductor chip 1 is arranged in the recess 61 of the housing 6. Furthermore, a conversion element 2 is arranged in the recess 61 in the beam path of the semiconductor chip 1. The conversion element 2 has a layer structure 7. The layer structure 7 has inorganic barrier layers 31, 32, 33, 34. In this case, four inorganic barrier layers are present. However, it is also possible for more than four inorganic barrier layers, for example ten inorganic barrier layers, to be present. The inorganic barrier layers 31, 32, 33, 34 are each spatially separated from one another by a layer comprising the hybrid polymer 41, 42, 43, 44 so that an alternating sequence of an inorganic barrier layer 31 and a hybrid polymer layer 42 is present. The component 100 also comprises a further hybrid polymer layer 8. The further hybrid polymer layer 8 covers both the surfaces of the recess 61 and the side faces and surfaces of the semiconductor chip 1 in a form-fitting manner. The quantum dots 5 are in particular embedded in the layer 41, that is the hybrid polymer layer 41, between the further barrier layer 8 and the barrier layer 31 in the so-called volume casting. In particular, Ormoclear is used as the hybrid polymer. A component 100 can thus be provided which has a conversion element 2 which acts as an encapsulation element, too.

FIG. 2B shows an optoelectronic component 100 according to an embodiment. The optoelectronic component 100 has no further barrier layer 8 in comparison to the component of FIG. 2A. In this case, the quantum dots 5 are arranged in the inorganic barrier layers 31, 32, 33, 34. In particular, the hybrid polymer is an Ormoclear.

FIG. 2C shows a schematic side view of an optoelectronic component according to an embodiment. In this case, the further barrier layer 8 covers both the surfaces of the recess 61, the housing surfaces 16 and the surfaces and the side faces of the semiconductor chip 1 in a form-fitting manner. The inorganic barrier layers 31 to 33 are arranged close to the chip, wherein a volume casting of hybrid polymer 43 is subsequently arranged downstream of the inorganic barrier layers. In this case, in particular the quantum dots are arranged in the inorganic barrier layers 31 to 33, in particular on the semiconductor chip. In particular, the hybrid polymer 4 is an Ormoclear. In particular, the inorganic barrier layers 31 to 33 fit in a form-fitting manner to the surface of the semiconductor chip.

According to a further embodiment, quantum dots 5 can also be combined with the hybrid polymer 4 in already existing film structures in so-called "roll-to-roll sheets". For example, blue-emitting and stable materials, such as PET, can be used. Thus, stable conversion elements can be provided.

Compared to optoelectronic components 100 described here, conventional components have a glass tube 17 with quantum dots 5 which are applied as a conversion element to a plurality of semiconductor chips 1. This leads to a rigid system comprising the glass tube 17, the quantum dots 5 and a plurality of semiconductor chips 1 (see FIG. 2D).

Figure 3A:
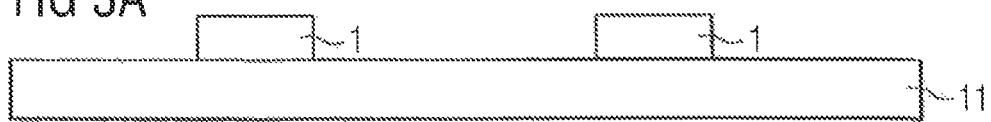
Figure 3B:
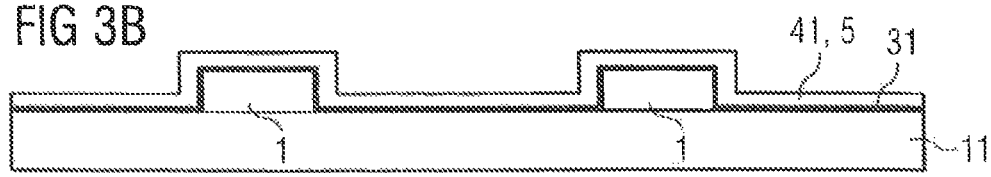
Figure 3C:
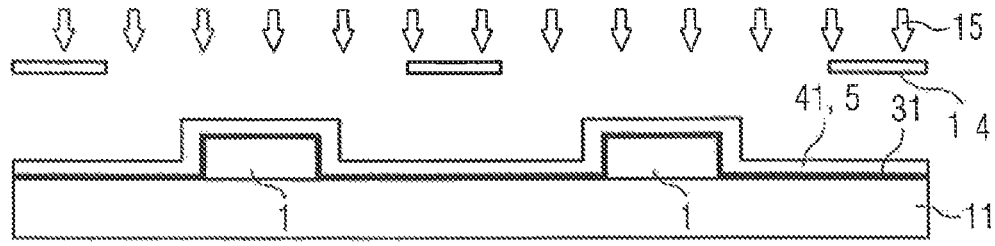
Figure 3D:
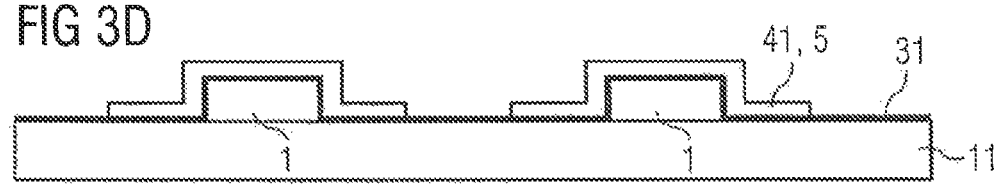
Figure 3E:
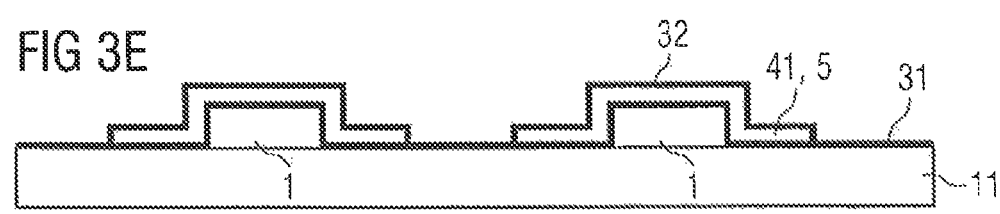
Figure 3F:
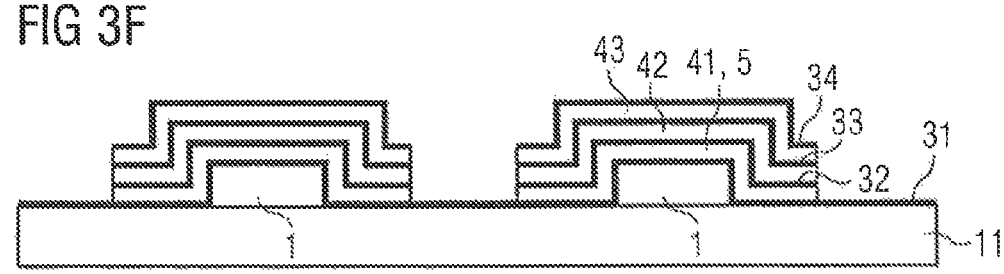

FIGS. 3A to 3F show a method for producing an optoelectronic component. FIG. 3A shows the provision of a substrate 11 and the application of at least one semiconductor chip 1, in this case two semiconductor chips 1. An inorganic barrier layer 31 is subsequently completely applied to the surface of the substrate 11, to the surface of the semiconductor chips 1 and to the side faces of the semiconductor chip 1. The inorganic barrier layer 31 can be applied by means of evaporation, PECVD, ALD, PLD at low temperatures. Subsequently, a layer comprising the hybrid polymer 41 and quantum dots 5 can be applied over the whole area to the inorganic barrier layer 31. Thicker layers having a layer thickness of >10 µm can be applied, for example, by means of spray coating. Thinner layers having a layer thickness of <10 µm can be applied, for example, by means of spin coating.

The structured curing of at least the hybrid polymer 41 is then carried out. The curing can be effected by means of UV or temperature or heat. The structured curing can be effected by means of a mask 14 and UV radiation 15. This results in selective and structured curing of the hybrid polymer layer 41. Subsequently, the non-structured regions or non-cured regions can be removed so that a selective layer of the hybrid polymer layer is obtained.

Subsequently, an additional inorganic barrier layer 32 can be applied at least to the hybrid polymer layer 41. Steps 3B to 3E can be repeated as desired and, thus, a layer structure 7, which comprises an alternating sequence of inorganic barrier layers 31, 32, 33 and hybrid polymer layers 41, 42, 43 can be formed.

Figure 4A:
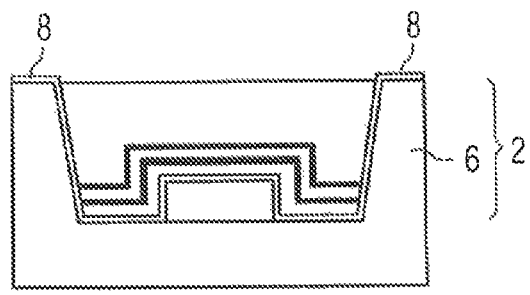
Figure 4B:
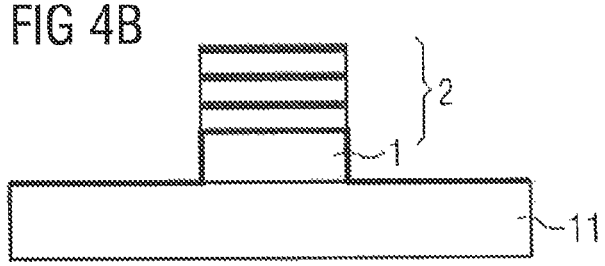

FIGS. 4A and 4B each show a schematic side view of an optoelectronic component according to an embodiment. FIG. 4A shows a conversion element 2 which has been produced within the recess of a housing 6. In comparison thereto, FIG. 4B shows a conversion element 2 which has been produced outside a housing 6. After the conversion element 2 of FIG. 4B has been produced, the component 100 of FIG. 4B can be introduced into a housing. In particular, in the case of the component of FIG. 4B, the lateral extent of the conversion element 2 and of the semiconductor chip 1 is the same. The size of the conversion element or the lateral extent of the conversion element can be determined by means of UV curing. This is dependent on the masking and on the photostructuring step. After the inorganic barrier layers of the component of FIG. 4A have been applied, a volume potting having a hybrid polymer layer can be introduced, which is in particular quantum dot-free. In particular, the quantum dots 5 are located between the semiconductor chip and the inorganic barrier layers 31, 32, 33.

According to one embodiment, the quantum dots 5 are embedded in the hybrid polymer 4, in particular an Ormoclear. The embedding can be effected by means of a deposition process. For example, inkjet methods or aerosol jet methods can be used.

Figure 5A:
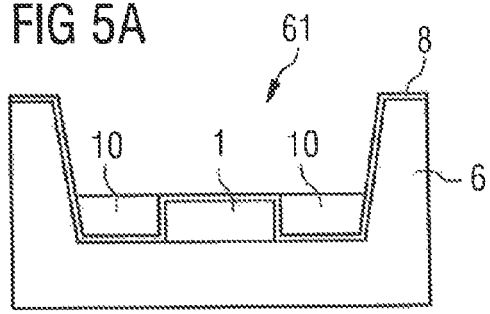
Figure 5B:
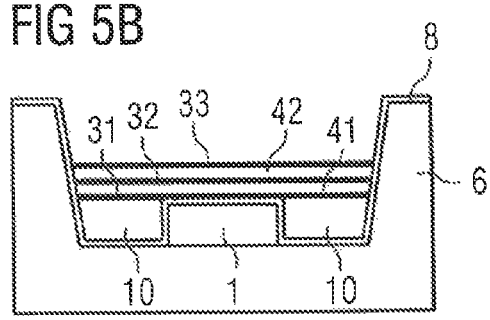

FIGS. 5A and 5B each show a schematic side view of an optoelectronic component according to an embodiment. The components of FIGS. 5A and 5B differ from the components of FIGS. 2A to 2C, in particular, in that the components additionally have a reflector element 10. In particular, the reflector element 10 surrounds the semiconductor chip 1. In particular, the reflector element 10 consists of titanium dioxide. Titanium dioxide is present in particular as particles. In particular, the reflector element 10 is selectively introduced between the side faces of the semiconductor chip 1 and the recess 61. In particular, the reflector element does not cover the radiation exit area of the semiconductor chip. The application can be carried out by means of jetting. Subsequently, for example, layers of quantum dots 5 and hybrid polymer 4 can be introduced. Also an alternating arrangement of inorganic barrier layers 31, 32, 33 and hybrid polymer layers 41, 42, 43 with or without quantum dots 5 is possible as an encapsulation. The outer side faces of the conversion element are defined in particular by the side faces of the recess.

The exemplary embodiments described in conjunction with the figures and the features thereof can also be combined with one another in accordance with further exemplary embodiments, even if such combinations are not explicitly shown in the figures. Furthermore, the exemplary embodiments described in conjunction with the figures can have additional or alternative features according to the description in the general part.

The invention is not restricted to the exemplary embodiments by the description on the basis of the exemplary embodiments. Rather, the invention encompasses any new feature and also any combination of features, which includes in particular any combination of features in the patent claims, even if this feature or this combination itself is not explicitly specified in the patent claims or exemplary embodiments.

This patent application claims the priority of German patent application 10 2016 103 463.0, the disclosure content of which is hereby incorporated by reference.

LIST OF REFERENCE SIGNS

100 optoelectronic component
1 semiconductor chip
2 conversion element
3 barrier layer
31, 32, 33 . . . barrier layers
4 hybrid polymer
41, 42, 43 . . . hybrid polymers or layers of hybrid polymer
5 quantum dots
61 recess
6 housing
7 layer structure
8 further barrier layer
9 further hybrid polymer layer
10 reflector element
11 substrate
12 defects
13 moisture, such as water
14 mask
15 UV and/or temperature
16 housing surface

The invention claimed is:

1. An optoelectronic component comprising
a semiconductor chip which is designed to emit radiation,
a conversion element that comprises quantum dots which are designed for wavelength conversion of radiation,
wherein the conversion element has a layer structure having a plurality of inorganic barrier layers,
wherein the inorganic barrier layers are spatially separated from one another at least in regions by a hybrid polymer wherein the hybrid polymer has organic and inorganic regions which are covalently bonded to one another, wherein the quantum dots are embedded in at least one of the hybrid polymer and one or more of the barrier layers.

2. The optoelectronic component according to claim 1, wherein the semiconductor chip is arranged in a recess of a housing and the conversion element is arranged in the beam path of the semiconductor chip,
wherein the layer structure of the conversion element comprises at least ten inorganic barrier layers,
wherein the layer structure comprises an alternating layer sequence comprising the inorganic barrier layer and a layer comprising the hybrid polymer,
wherein a further barrier layer covers at least one of surfaces of the recess of the housing and surfaces of the semiconductor chip in a form-fitting manner.

3. The optoelectronic component according to claim 2, wherein the further barrier layer additionally covers an outer surface of the housing in a form-fitting manner.

4. The optoelectronic component according to claim 1, wherein the semiconductor chip is arranged in a recess of a housing and the conversion element is arranged in the beam path of the semiconductor chip,
wherein the layer structure of the conversion element comprises at least ten inorganic barrier layers, the layer structure forms an alternating layer sequence of the inorganic barrier layer and a layer comprising the hybrid polymer,
wherein at least one further layer comprising the hybrid polymer covers at least one of surfaces of the recess of the housing and surfaces of the semiconductor chip in a form-fitting manner.

5. The optoelectronic component according to claim 4, wherein, seen in cross section, the further layer has a thickness between 100 p.m and 1000 p.m inclusive.

6. The optoelectronic component according to claim 4, wherein the further layer has a homogeneous layer thickness between 0.2 p.m and 100 p.m inclusive.

7. The optoelectronic component according to claim 1, wherein the quantum dots have a proportion of between 0.001% and 5% by weight in the hybrid polymer.

8. The optoelectronic component according to claim 1, wherein the inorganic barrier layers each have a material selected from the group consisting of silicon dioxide, aluminum oxide, titanium oxide, zinc-tin oxide, silicon nitride, and combinations thereof.

9. The optoelectronic component according to claim 1, wherein the hybrid polymer is an Ormocer.

10. The optoelectronic component according to claim 1, wherein the conversion element is arranged in the beam path of the semiconductor chip,
wherein the layer structure has at least two alternating layer sequences of the inorganic barrier layer and a layer comprising the hybrid polymer,
wherein side faces of the semiconductor chip and a side face of the conversion element have the same lateral extent, seen in cross-section, and are covered by a further barrier layer in a formfitting manner.

11. The optoelectronic component according to claim 10, which can be introduced into a recess of a housing.

12. The optoelectronic component according to claim 1, wherein the semiconductor chip is arranged in a recess of a housing and the conversion element is arranged in the beam path of the semiconductor chip,
wherein the layer structure comprises at least one alternating layer sequence of the inorganic barrier layer and a layer comprising the hybrid polymer,
wherein a further barrier layer covers at least one of surfaces of the recess of the housing and surfaces and side faces of the semiconductor chip in a form-fitting manner,
wherein a reflector element is arranged at a distance from the semiconductor chip, the reflector element surrounds the side faces of the semiconductor chip.

13. A method for producing an optoelectronic component according to claim 1, comprising the steps of:
A) providing a substrate,
B) applying at least one semiconductor chip to the substrate,
C) applying an inorganic barrier layer to the substrate and the semiconductor chip,
D) applying a layer of a hybrid polymer which has organic and inorganic regions that are covalently bonded to one another, wherein quantum dots are embedded in the hybrid polymer,
E) structured curing of at least the hybrid polymer by means of UV or heat,
F) applying additional barrier layers and additional layers comprising the hybrid polymer so that a layer structure of an alternating sequence of barrier layers and layers comprising the hybrid polymer are produced.

14. The method according to claim 13, wherein the method steps A) to F) are done one after the other and the temperature of each method step is at most 100° C.

* * * * *